United States Patent [19]

Ephrath

[11] 4,426,274

[45] Jan. 17, 1984

[54] REACTIVE ION ETCHING APPARATUS WITH INTERLACED PERFORATED ANODE

[75] Inventor: Linda M. Ephrath, Danbury, Conn.

[73] Assignee: International Business Machines Corporation, Armonk, N.Y.

[21] Appl. No.: 269,160

[22] Filed: Jun. 2, 1981

[51] Int. Cl.$^3$ .............................................. C23C 15/00
[52] U.S. Cl. .................................. 204/298; 204/192 R
[58] Field of Search ......................................... 204/298

[56] References Cited

U.S. PATENT DOCUMENTS

| | | | |
|---|---|---|---|
| 2,097,233 | 10/1937 | Meston | 204/192 R |
| 3,410,774 | 11/1968 | Barson et al. | 204/192 E |
| 3,826,729 | 7/1974 | Byers et al. | 204/192 E |
| 3,860,783 | 1/1975 | Schmidt et al. | 204/192 E |
| 4,119,881 | 10/1978 | Calderon | 204/192 E |
| 4,131,533 | 12/1978 | Bialko et al. | 204/298 |
| 4,153,528 | 5/1979 | Dykeman et al. | 204/192 R |
| 4,158,589 | 6/1979 | Keller et al. | 204/298 |
| 4,230,515 | 10/1980 | Zajac | 204/192 E |
| 4,297,162 | 10/1981 | Mundt et al. | 204/298 |
| 4,307,283 | 12/1981 | Zajac | 204/192 E |

OTHER PUBLICATIONS

Smits, J. Vac. Sci. Technol., 19(3) Sep./Oct. 1981, pp. 704–708.
Radiation Damage in Silicon Dioxide Films Exposed to Reactive Ion Etching by D. J. DiMaria, et al., "Journal of Applied Physics", 50(6) 6/79, p. 4015.
Reactive Sputter Etching System with Floating Grid by H. Shibayama et al., "Digest of Technical Papers-11th Conference (1979 International) on Solid State Devices, Tokyo".

Primary Examiner—Arthur P. Demers
Attorney, Agent, or Firm—Thomas J. Kilgannon

[57] ABSTRACT

Reactive Ion Etching (RIE) apparatus which provides for uniform etching of substrates regardless of their position on a cathode is disclosed. The RIE apparatus utilizes a perforated anode. These perforations are interlaced, intersected or partially blocked with various configurations of conductive elements. Concentric circle, starburst, spiral arm and spiral configurations may be interlaced with the perforations in the anode to obtain uniform etching of substrates regardless of their radial position on the cathode. With all these configurations, the common factor is that the interlaced configurations intersect more perforations near the center of the anode or catcher plate than are intersected at greater radial distances.

34 Claims, 5 Drawing Figures

REACTIVE ION ETCHING APPARATUS WITH INTERLACED PERFORATED ANODE

DESCRIPTION

1. Technical Field

This invention relates to Reactive Ion Etching (RIE) apparatus and more particularly relates to apparatus which provides for uniform etching of substrates regardless of their position on the cathode. Still more particularly it relates to reactive ion etching apparatus which utilizes a perforated anode, the perforations of which are interlaced with various configurations of conductive elements which either intersect or partially block the perforations. The result is that substrates recessed in the surface of the cathode experience a uniform etch rate regardless of their position on the cathode.

2. Background Art

Reactive Ion Etching (RIE) is now a relatively well known technique which finds wide utility in the manufacture of integrated circuits.

Typical RIE systems are shown in an article entitled "Radiation Damage in Silicon Dioxide Films Exposed to Reactive Ion Etching" by D. J. DiMaria et al, Journal of Applied Physics, 50(6) June 1979, p. 4015. In the system of the article, a perforated anode plate is utilized to confine the plasma to the volume between the cathode and the anode to increase etch rates and to prevent backscattering of material that is sputtered from the electrode. Another article entitled "Reactive Sputter Etching System With Floating Grid" by H. Shibayama et al in the Digest of Technical Papers, the 11th Conference (1979 International) on Solid State Devices, Tokyo suggests the use of a third electrode having many perforations. In systems of the kind described in the first article, nonuniformity of etch rates is a problem. The major contribution to nonuniform etching of silicon dioxide in $CF_4$ is radial with etch rates faster near the center of the cathode. Radial nonuniformity is especially pronounced when a perforated anode or catcher plate is used to reduce back sputtering of chemically inert materials on the cathode. To the extent that nonuniform etching, which is a function of radial distance from the center of the cathode occurs, the problem is a serious one in terms of process control and yield of semiconductor substrates. As far as is presently known, no solution has been provided for the problem of nonuniform etch rates, and if any has been proposed, it does not deal with the modification of the structure of the perforated anode or catcher plate.

It is, therefore, a principal object of this invention to provide Reactive Ion Etching apparatus wherein substrates disposed on the cathode experience substantially uniform etch rates regardless of their position on the cathode.

It is another object of the present invention to provide ion etching apparatus which enhances the yield of substrates being etched.

It is another object of the present invention to provide apparatus wherein modification to the catcher plate in accordance with the teaching of the present invention, provides for uniform etching of substrates and increased yield.

BRIEF SUMMARY OF THE INVENTION

The present invention relates to Reactive Ion Etching (RIE) apparatus which utilizes a perforated anode or catcher plate. The apparatus does not depart in any way from known Reactive Ion Etching apparatus except that the anode or catcher plate is modified by interlacing a continuous, conductive element or continuous, conductive elements with the perforations of the anode or catcher plate in any one of a number of configurations. Concentric circle, starburst, spiral arm and spiral configuration may be interlaced with the perforations in the anode to obtain uniform etching of substrates regardless of their radial position on the cathode. With all these configurations, the common factor is that the interlaced configurations intersect more perforations near the center of the anode or catcher plate than are intersected at greater radial distances. Indeed, in all the proposed configurations, the extent of the conductive elements is terminated short of the periphery of the cathode. To the extent that radial etching uniformity decreases as cathode size increases, especially when a perforated catcher plate is used, it has been determined that the present approach can be scaled and applied to systems having large cathode sizes.

These and other objects, features and advantages will be more apparent from the following more particular description of the preferred embodiments.

DESCRIPTION OF PREFERRED EMBODIMENTS

Figure 1:
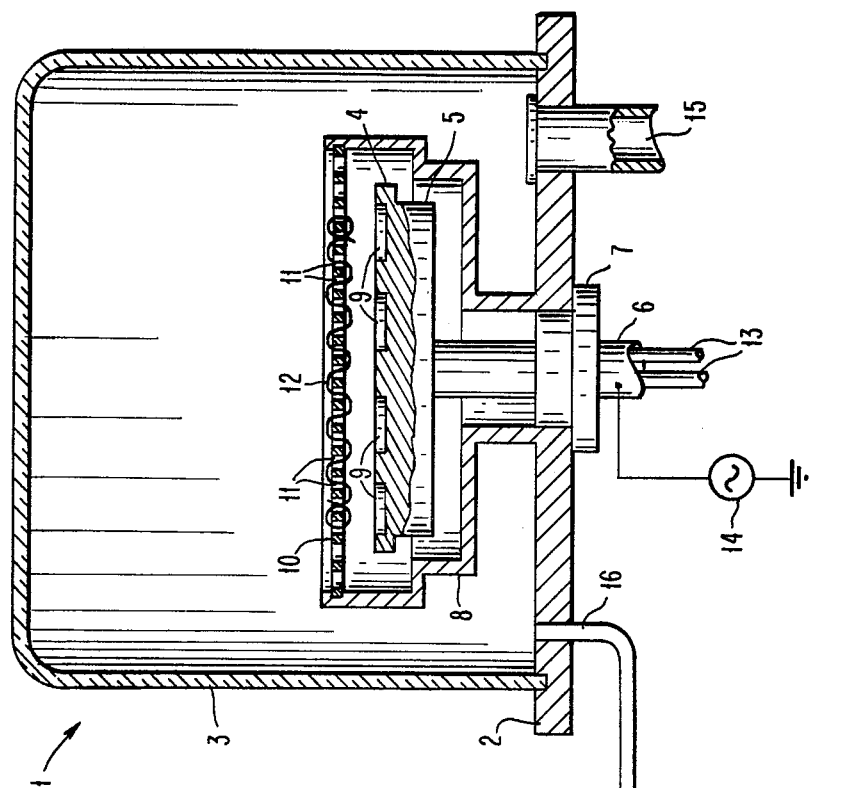
FIG. 1 is a partially schematic, cross-sectional drawing of reactive ion etching apparatus showing a perforated anode or catcher plate and at least a continuous conductive element interlacing certain of the perforations.
Figure 1:
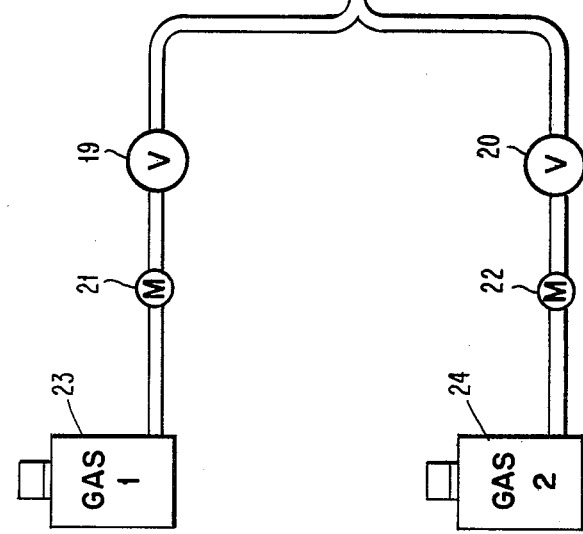

FIG. 1 shows a partially schematic cross-sectional view of Reactive Ion Etching (RIE) apparatus in accordance with the teaching of the present invention. In FIG. 1, there is shown a vacuum housing 1 which includes a base plate 2 and a bell jar 3 which may be made of glass or metal and is hermetically sealed to base plate 2. A cathode plate 4 is shown disposed within bell jar 3 which is electrically and mechanically connected to a cathode 5.

In FIG. 1, cathode 5 is preferably a radio frequency electrode which is supported by an electrode support element 6 which passes through base plate 2 via a feedthrough insulator 7. Electrode support element 6 and feedthrough insulator 7 hold cathode 5 in substantially parallel relationship with base plate 2. A shield 8 extending from base plate 2 is spaced from and conformal with cathode plate 4, cathode 5 and electrode support element 6. A plurality of recesses 9 is shown disposed in the surface of cathode plate 4 into which substrates which are to be etched are receivable.

A perforated anode or catcher plate 10 is shown in FIG. 1 disposed opposite cathode plate 4 and supported by a portion of shield 8 on its periphery. Perforated anode 10 partially confines the plasma to the volume between perforated anode 10 and cathode 5. A diffuse glow still fills the remaining volume of the reactor. A continuous, conductive element 12 is shown interlaced with perforations 11 in anode plate 10. The configuration of element 12 will be discussed in more detail hereinafter but suffice it to say for the present that it is shown in FIG. 1 in interlacing relationship with perforations 11 to show the preferred mode of disposing element 12 in contiguous relationship with cathode 5.

Cathode 5 which is usually made of copper is provided with a fluid conduit 13 for cooling cathode plate 4 if desired. A radio frequency power source 14 which provides power to the RIE system is shown connected between electrode support element 6 and ground.

Perforated anode or catcher plate 10 in addition to being mechanically connected to shield 8 is electrically at the same potential as shield 8 and is grounded. Anode plate 10 is preferably positioned about one inch away from cathode plate 4. To the extent that there is a tendency for the material of cathode plate 4 to sputter somewhat, anode plate 10 is used to intercept the sputtered material and prevent it from diffusing back onto the surface of the substrate being etched. Such sputtering can occur when cathode plate 4 is made of a metal such as aluminum, stainless steel or copper.

In FIG. 1, an exhaust pipe 15 is shown piercing vacuum envelope 1 which is used for evacuating the space enclosed therein. Exhaust pipe 15 is connected to a vacuum pump (not shown). Envelope 1 is evacuated prior to subjecting the substrate to the reactive ion etching process. Vacuum envelope 1 is also pierced by a conduit 16 which splits into conduits 17 and 18. Conduits 17,18 are provided with variable leak valves 19,20, respectively, and mass flow meters 21,23, respectively. Each combination of leak valve and flow meter can be replaced by equipment which carries out the functions such as a flow controller. Mass flow meters and controllers are available commercially from Matheson under the trade designation Series 8240 and 8260 Mass Flow Controllers and from Tylan Corporation under the trade designation Model FM-300 and FM-302 Mass Flow Meter and Model FC-200 and FC-202 Mass Flow Controller. Mass flow meters and controllers actually measure molecular flow by volume by unit time such as standard cubic centimeters per minute. Conduit 18 is connected to a gas storage vessel 23 for one of the gases utilized in reactive ion etching while conduit 17 connects to gas storage vessel 24 for the other of the gases. While only two gas storage vessels and their associated equipment have been shown in FIG. 1, it should be appreciated that other gases, if required, may be connected to vacuum envelope 1 in the same manner as vessels 23,24.

In FIG. 1, continuous, conductive element 12 is preferably made of thin, aluminum coated, copper wires. Other materials such as refractory metals (tungsten) have also been successfully utilized.

In FIG. 1, substrates are normally disposed in recesses 9 in cathode plate 4 such that the surfaces of the substrates are flush with the surface of cathode plate 4.

Figure 2:
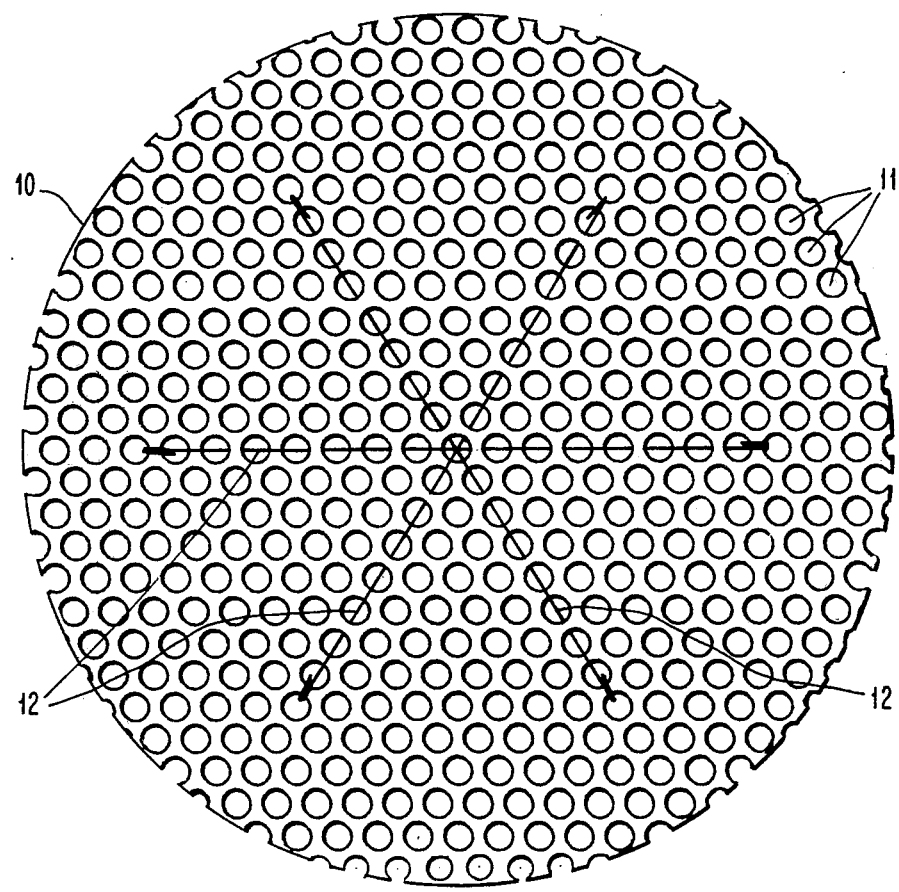
FIG. 2 is a top view of the anode or catcher plate of FIG. 1 showing a plurality of perforations formed in the plate. Also shown is a plurality of continuous, conductive elements interlacing certain of the perforations along their radial paths. The conductive elements have a ray-like or starburst configuration.

In normal operation, the system of FIG. 1 is evacuated with an oil diffusion pump and then backfilled with a desired gas to establish a dynamic pressure between 20 and 100 millitorr. During etching, 0.1–1.0 watts/cm$^2$ of power is delivered to cathode 5. To the extent that the operating conditions are relatively standard, the reactive ion etching process carried out in the apparatus in FIG. 1 is relatively straight-forward. However, depending on whether or not a conductive element 12 is interlaced with perforations 11 in perforated anode or catcher plate 10 the results achieved in terms of etch rate as a function of radial distance from the center of perforated anode or catcher plate 10 can be quite different. Data obtained for oxide disposed on the surface of a silicon substrate etched in $CF_4$ and 40% $H_2$ in a system similar to that shown in FIG. 1 wherein a 7 inch cathode plate 4 is used is summarized as follows:

|  | Uniformity Over Cathode |
|---|---|
| No Catcher Plate 10 | ±2.0% |
| Perforated Catcher Plate 10 Alone | ±8.2% |
| Perforated Catcher Plate 10 with Elements 12 in Radial Configuration of FIG. 2 | ±1.4% |

Similar uniformities are obtained under the same circumstances for polysilicon wafers etched in $CF_4$.

Referring now to FIG. 2, there is shown a top view of perforated anode or catcher plate 10 wherein a plurality of conductive elements 12 are shown extending radially in a starburst or ray-like configuration from the center of anode plate 4 in interlacing relationship with perforations 11 along the radial path of elements 12. As can be clearly seen from FIG. 2, elements 12 extend from the center of anode plate 10 and are interlaced with perforations 11 in such a way that they partially block or intersect each of the perforations along the radial paths of elements 12. Elements 12 do not extend to the periphery of anode or catcher plate 10 but rather terminate short of the periphery of plate 10. More specifically, elements 12 in FIG. 2 preferably terminate at a distance from the center of anode plate 10 at a point which is a little greater than one-half the radius of plate 10. However, elements 12 can extend to the periphery of anode plate 10 provided the criterion that a larger number of perforations be laced near the center is met. Thus, some of element 12 may extend to the periphery of plate 10 while other elements extending radially between them need only extend a short distance from this center.

While elements 12 have been characterized as conductive, continuous elements in conncection with the foregoing description, it should be appreciated that elements 12 need not be continuous but may be discontinuous to the extent that there need be no interconnections between the conductive portions which partially block the desired perforations 11. Thus, the desired perforations may be partially blocked or intercepted by a small conductive element which extends, for example, across the diameter of each perforation 11. To the extent that interlaced elements eliminate the obvious manufacturing difficulties in the last mentioned approach, the present interlacing approach is preferred.

Figure 3:
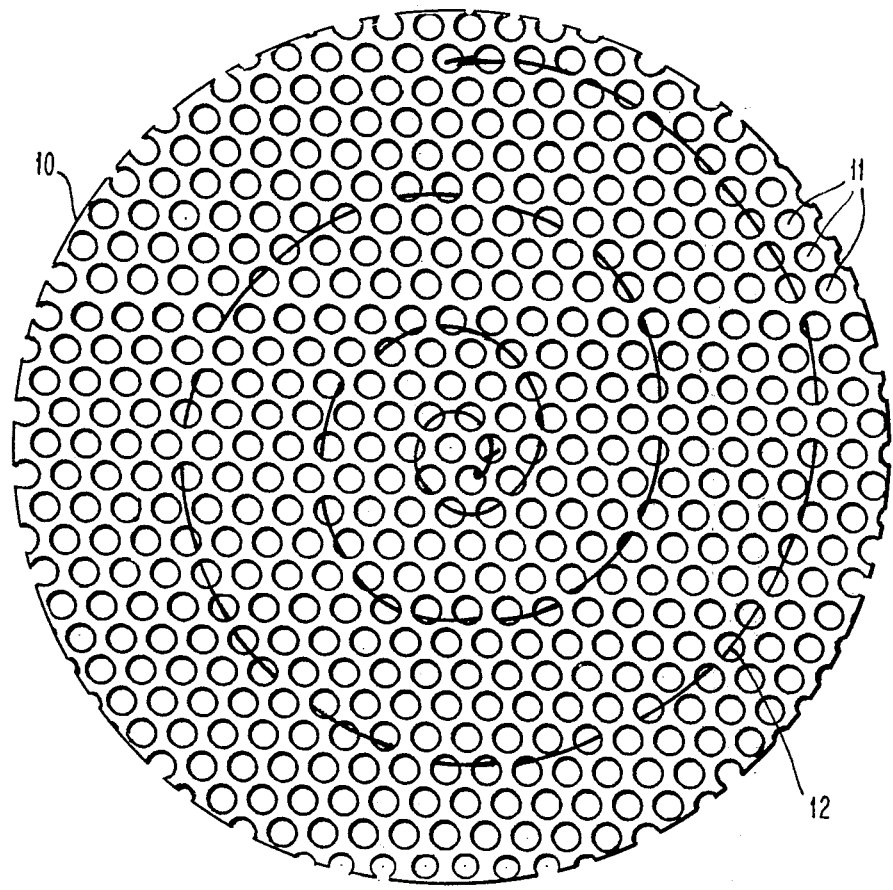
FIG. 3 is a view similar to that shown in FIG. 2 except that a single continuous, conductive element which interlaces certain of the perforations has a spiral configuration. Portions of the spiral intersect or partially block perforations through which they pass from one side of the anode to the other.

Referring now to FIG. 3, there is shown a perforated anode plate 10 similar to that shown in FIG. 2 but differs therefrom in that a single, conductive element 12 having a spiral configuration is shown disposed in interlaced relationship with perforations 11 along its spiral path.

As with the starburst configuration of FIG. 2, a higher density of perforations 11 are intercepted by element 12 near the center of anode plate 10 than near the periphery of anode plate 10. Element 12 in FIG. 3 is terminated short of the periphery of anode or catcher plate 10 though it can extend to the periphery of plate 10. As with elements 12 in FIG. 2, element 12 in FIG. 3 may be discontinuous in that the portions not intersecting or partially blocking perforations 11 need not be present. As before, however, the simple interlacing approach overcomes obvious manufacturing difficulties.

Figure 4:
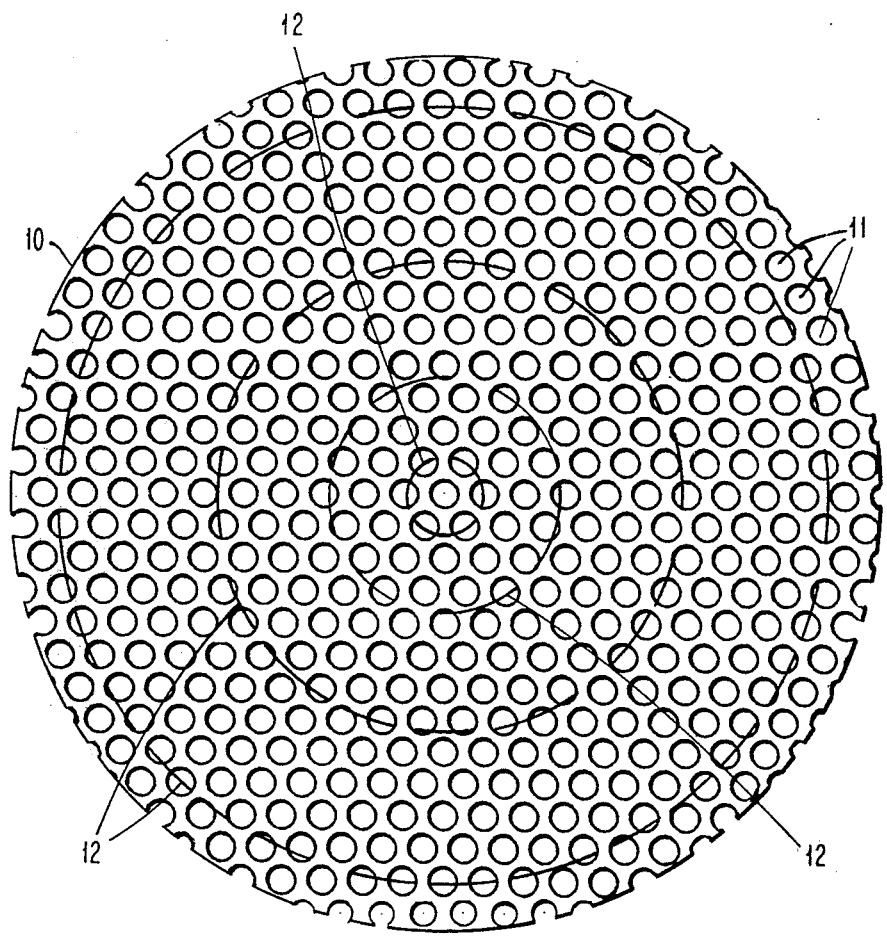
FIG. 4 is a view similar to that shown in FIG. 2 except that a plurality of continuous, conductive elements each having a circular configuration interlace certain of the perforations and are disposed concentrically about the center of the anode.
Figure 5:
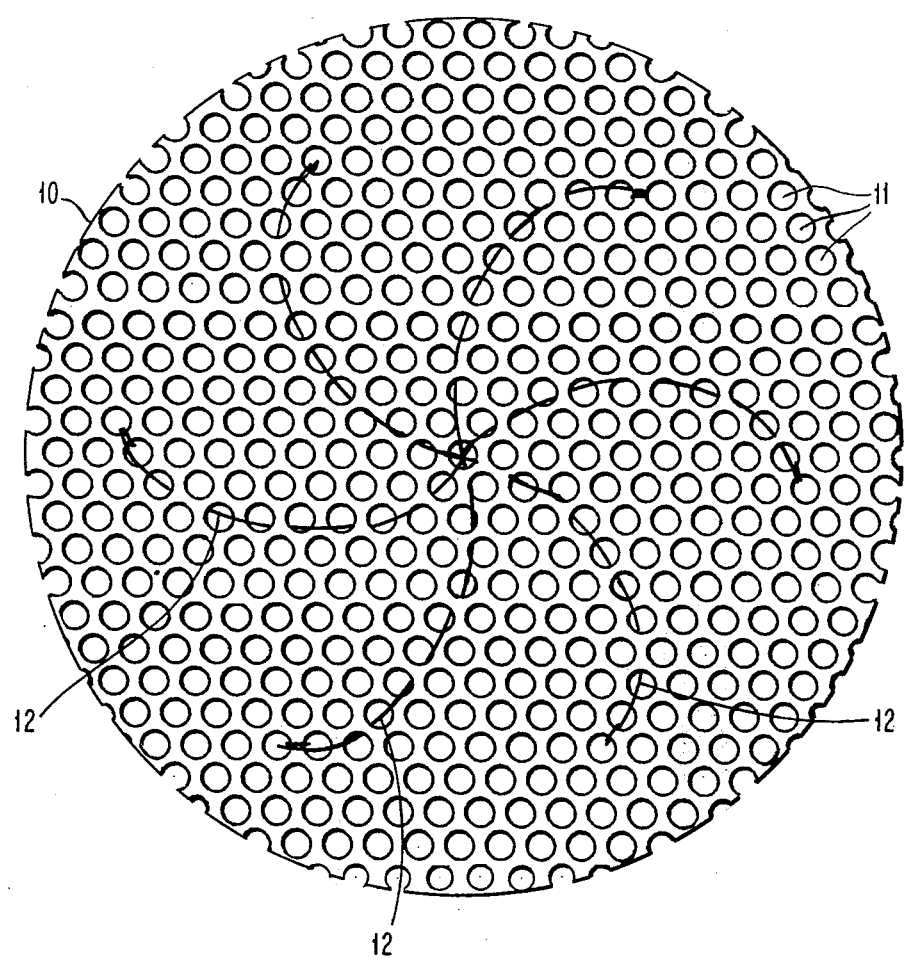
FIG. 5 is similar to the view shown in FIG. 2 except that the radially extending elements of FIG. 2 are changed to have the spiral arm configuration shown in FIG. 5.

FIGS. 4 and 5 show other configurations which achieve the same results as the configuration shown in FIGS. 2, 3. FIG. 4 shows a plurality of elements 12 arranged in concentric circles about the center of anode plate 10. Each of the concentric circles is spaced from a preceding circle by an amount greater than the radius of a preceding circle. In FIG. 5, elements 12 extend radially from the center of anode plate 10 in a spiral arm configuration. Elements 12 in FIG. 5 terminate short of the periphery of anode plate 10 but can extend to the periphery thereof.

While all of the above arrangements are symmetrical in character, it should be appreciated that configurations which are not symmetrical can be utilized to compensate for non-uniform etch rates which result from a lack of cylindrical symmetry in the reactive ion etch system. This cylindrical asymmetry results from the presence of pump ports, windows, supporting structures and the like.

As indicated hereinabove, the present approach which provides uniform etch rates to substrates regardless of their radial position from the center of a cathode plate is not limited by the increasing size of a cathode plate. Thus, the benefits achieved do not appear to be a function of scale. Also, the effect of obtaining substantially uniform etch rates is not limited by the type of materials or the gases utilized. The use of elements 12 is effective if the plasma is confined between cathode plate 4 and anode plate 10. To the extent that the pressure in the system controls whether or not the plasma is confined between the two plates, pressure adjustments can be made to achieve the desired confining of the plasma. Thus, for example, a pressure of 25 microns has proved satisfactory where the perforations 11 in anode plate 10 were one-quarter inch in diameter. In general, it can be stated that as the pressure of the gaseous specie or species is increased, the size of perforations 11 is decreased.

Having thus described my invention, what I claim as new, and desire to secure by Letters Patent is:

1. Reactive ion etching apparatus comprising
   a cathode,
   an anode having a plurality of perforations therein disposed in spaced relationship with said cathode, and,
   means disposed in contiguous relationship with said anode for controlling the etch rate of said apparatus to provide a substantially uniform etch rate of materials contacting said cathode.

2. Reactive ion etching apparatus according to claim 1 wherein said means for controlling the etch rate includes means disposed in intersecting relationship with certain of said plurality of perforations.

3. Reactive ion etching apparaus according to claim 1 wherein said means for controlling the etch rate includes means disposed in interlacing relationship with certain of said plurality of perforations.

4. Reactive ion etching apparatus according to claim 1 wherein said means for controlling the etch rate includes means disposed in partially blocking relationship with certain of said plurality of perforations.

5. Reactive ion etching apparatus according to claim 1 further including a plurality of recesses disposed in said cathode into which substrates are receivable.

6. Reactive ion etching apparatus according to claim 2 wherein said means for controlling the etch rate includes means disposed in intersecting relationship with certain of said perforations a portion of said means extending through and across said certain of said perforations from one side of said anode to the other side of said anode.

7. Reactive ion etching apparatus according to claim 2 wherein said means disposed in intersecting relationship includes a plurality of continuous, conductive spiral arm elements extending radially from rhe center of said anode each of said elements intersecting a group of said certain of said plurality of perforations along its spiral arm, radial path.

8. Reactive ion etching apparatus according to claim 2 wherein said means disposed in intersecting relationship includes a plurality of continuous, conductive elements extending radially from the center of said anode, each of said elements intersecting a group of said certain of said plurality of perforations along its radial path.

9. Reactive ion etching apparatus according to claim 2 wherein said means disposed in intersecting relationship includes a continuous, conductive element extending spirally from the center of said anode said element intersecting said certain of said plurality of perforations along its spiral path.

10. Reactive ion etching apparatus according to claim 2 wherein said means disposed in intersecting relationship includes a plurality of continuous, conductive elements arranged in concentric circles about the center of said anode each of said elements intersecting a group of said certain of said plurality of perforations along its circular path.

11. Reactive ion etching apparatus according to claim 3 wherein said means for controlling the etch rate includes means disposed in interlacing relationship with certain of said perforations, a portion of said means extending through and across said certain of said perforations from one side of said anode to the other side of said anode.

12. Reactive ion etching apparatus according to claim 3 wherein said means disposed in interlacing relationship includes a plurality of continuous, conductive elements arranged in concentric circles about the center of said anode each of said elements being interlaced with a group of said certain of said plurality of perforations along its circular path.

13. Reactive ion etching apparatus according to claim 3 wherein said means disposed in interlacing relationship includes a continuous, conductive element extending spirally from the center of said anode said element being interlaced with said certain of said plurality of perforations along its spiral path.

14. Reactive ion etching apparatus according to claim 3 wherein said means disposed in interlacing relationship includes a plurality of continuous, conductive elements extending radially from the center of said anode each of said elements being interlaced with a group of said certain of said plurality of perforations along its radial path.

15. Reactive ion etching apparatus according to claim 3 wherein said means disposed in interlacing relationship includes a plurality of continuous, conductive spiral arm elements extending radially from the center of said anode each of said elements being interlaced with a group of said certain of said plurality of perforations along its spiral arm, radial path.

16. Reactive ion etching apparatus according to claim 4 wherein means for controlling the etch rate includes means disposed in partially blockin relationship with certain of said perforations a portion of said means extending through and across said certain of said perforations from one side of said anode to the other side of said anode.

17. Reactive ion etching apparatus according to claim 4 wherein said means disposed in partially blocking relationship includes a plurality of continuous, conductive elements arranged in concentric circles about the center of said anode each of said elements partially blocking a group of said certain of said plurality of perforations along its circular path.

18. Reactive ion etching apparatus according to claim 4 wherein said means disposed in partially blocking relationship includes a continuous, conductive element extending spirally from the center of said anode said element partially blocking said certain of said plurality of perforations along its spiral path.

19. Reactive ion etching apparatus according to claim 4 wherein said means disposed in partially blocking relationship includes a plurality of continuous, conductive elements extending radially from the center of said anode each of said elements partially blocking a group of said certain of said plurality of perforations along its radial path.

20. Reactive ion etching apparatus according to claim 4 wherein said means disposed in partially blocking relationship includes a plurality of continuous, conductive spiral arm elements extending radially from the center of said anode each of said elements partially blocking a group of said certain plurality of perforations along its spiral arm, radial path.

21. Reactive ion etching apparatus according to claim 5 further including a vacuum housing surrounding said cathode, said anode and said means for controlling the etch rate, means connected to said cathode for applying radio frequency power, and, means connected to said housing for introducing at least a single gas into said apparatus.

22. Reactive ion etching apparatus according to claim 7 wherein said spiral arm elements terminate short of the periphery of said anode.

23. Reactive ion etching apparatus according to claim 8 wherein said elements terminate short of the periphery of said anode.

24. Reactive ion etching apparatus according to claim 9 wherein said element terminates short of the periphery of said anode.

25. Reactive ion etching apparatus according to claim 10 wherein said conductive elements are disposed within the periphery of said anode.

26. Reactive ion etching apparatus according to claim 10 wherein said continuous, conductive elements arranged in concentric circles are spaced such that each circle is spaced from a preceding circle by an amount greater than the radius of a preceding circle.

27. Reactive ion etching apparatus according to claim 12 wherein said conductive elements are disposed within the periphery of said anode.

28. Reactive ion etching apparatus according to claim 13 wherein said element terminates short of the periphery of said anode.

29. Reactive ion etching apparatus according to claim 14 wherein said elements terminate short of the periphery of said anode.

30. Reactive ion etching apparatus according to claim 15 wherein said spiral arm elements terminate short of the periphery of said anode.

31. Reactive ion etching apparatus according to claim 17 wherein said conductive elements are disposed within the periphery of said anode.

32. Reactive ion etching apparatus according to claim 18 wherein said elements terminates short of the periphery of said anode.

33. Reactive ion etching apparatus according to claim 19 wherein said elements terminate short of the periphery of said anode.

34. Reactive ion etching apparatus according to claim 20 wherein said spiral arm elements terminate short of the periphery of said anode.

* * * * *